US010062629B2

(12) United States Patent
Maxim et al.

(10) Patent No.: US 10,062,629 B2
(45) Date of Patent: Aug. 28, 2018

(54) ANTENNA IMPEDANCE MATCHING AND APERTURE TUNING CIRCUITRY

(71) Applicant: RF Micro Devices, Inc., Greensboro, NC (US)

(72) Inventors: George Maxim, Saratoga, CA (US); Dirk Robert Walter Leipold, San Jose, CA (US); Marcus Granger-Jones, Scotts Valley, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 274 days.

(21) Appl. No.: 14/931,720

(22) Filed: Nov. 3, 2015

(65) Prior Publication Data
US 2016/0126623 A1   May 5, 2016

Related U.S. Application Data

(60) Provisional application No. 62/074,429, filed on Nov. 3, 2014.

(51) Int. Cl.
*H03H 7/38* (2006.01)
*H01L 23/31* (2006.01)
(Continued)

(52) U.S. Cl.
CPC ...... *H01L 23/315* (2013.01); *H01L 21/02266* (2013.01); *H01L 21/02282* (2013.01);
(Continued)

(58) Field of Classification Search
CPC ..... H01L 23/20; H01L 23/291; H01L 23/293; H01L 23/3135; H01L 23/36;
(Continued)

(56) References Cited

U.S. PATENT DOCUMENTS 6,154,372 A   11/2000 Kalivas et al.
6,268,654 B1   7/2001 Glenn et al.
(Continued)

OTHER PUBLICATIONS

Final Office Action for U.S. Appl. No. 14/885,202, dated Sep. 27, 2016, 7 pages.
(Continued)

*Primary Examiner* — Robert J Pascal
*Assistant Examiner* — Kimberly Glenn
(74) *Attorney, Agent, or Firm* — Withrow & Terranova, P.L.L.C.

(57) ABSTRACT

Antenna aperture tuning circuitry includes a first signal path and a second signal path coupled in parallel between an antenna radiating element and ground. A first LC resonator and a second LC resonator are each coupled between the first signal path and ground. The first LC resonator and the second LC resonator are electromagnetically coupled such that a coupling factor between the first LC resonator and the second LC resonator is between about 1.0% and 40.0%. A third LC resonator and a fourth LC resonator are each coupled between the second signal path and ground. The third LC resonator and the fourth LC resonator are electromagnetically coupled such that a coupling factor between the third LC resonator and the fourth LC resonator is between about 1.0% and 40.0%.

20 Claims, 15 Drawing Sheets

(51) Int. Cl.
*H01L 21/304* (2006.01)
*H01L 21/02* (2006.01)
*H01L 21/683* (2006.01)
*H01L 23/29* (2006.01)
*H01L 23/373* (2006.01)
*H01L 23/00* (2006.01)
*H05K 1/02* (2006.01)
*H05K 1/18* (2006.01)
*H01Q 1/50* (2006.01)
*H01L 23/36* (2006.01)
*H01L 21/56* (2006.01)
*H01L 23/20* (2006.01)
*H01L 23/367* (2006.01)
*H01L 21/306* (2006.01)
*H01L 23/522* (2006.01)
*H01L 49/02* (2006.01)

(52) U.S. Cl.
CPC .......... *H01L 21/304* (2013.01); *H01L 21/565* (2013.01); *H01L 21/6835* (2013.01); *H01L 23/20* (2013.01); *H01L 23/291* (2013.01); *H01L 23/293* (2013.01); *H01L 23/3135* (2013.01); *H01L 23/36* (2013.01); *H01L 23/367* (2013.01); *H01L 23/3731* (2013.01); *H01L 23/3737* (2013.01); *H01L 23/562* (2013.01); *H01Q 1/50* (2013.01); *H05K 1/0203* (2013.01); *H05K 1/181* (2013.01); *H01L 21/30604* (2013.01); *H01L 23/3121* (2013.01); *H01L 23/5223* (2013.01); *H01L 23/5227* (2013.01); *H01L 23/5228* (2013.01); *H01L 24/17* (2013.01); *H01L 28/10* (2013.01); *H01L 28/20* (2013.01); *H01L 28/40* (2013.01); *H01L 2221/6834* (2013.01); *H01L 2221/68327* (2013.01); *H01L 2221/68381* (2013.01); *H01L 2224/131* (2013.01); *H01L 2224/13147* (2013.01); *H01L 2224/16225* (2013.01); *H01L 2224/16227* (2013.01); *H01L 2224/73204* (2013.01); *H01L 2224/92125* (2013.01); *H01L 2924/0002* (2013.01); *H01L 2924/19011* (2013.01); *H01L 2924/19041* (2013.01); *H01L 2924/19042* (2013.01); *H01L 2924/19043* (2013.01)

(58) Field of Classification Search
CPC ............... H01L 23/3737; H01L 23/562; H01L 21/02266; H01L 21/02282; H01L 21/304; H01L 21/30604; H01L 23/3121; H01L 23/5223; H01L 23/5227; H01L 23/5228; H01L 24/178; H01L 24/17; H01L 28/10; H01L 28/20; H01L 28/40; H01L 2221/69327; H01L 2221/6834; H01L 2224/16225; H01L 2924/0002; H01L 2924/19011; H01L 2924/19041; H01L 2924/19043; H01Q 1/50
See application file for complete search history.

(56) References Cited

U.S. PATENT DOCUMENTS

| | | |
|---|---|---|
| 6,864,156 B1 | 3/2005 | Conn |
| 7,619,347 B1 | 11/2009 | Bhattacharjee |
| 2004/0164367 A1 | 8/2004 | Park |
| 2007/0121326 A1 | 5/2007 | Nall et al. |
| 2013/0155681 A1 | 6/2013 | Nall et al. |
| 2014/0210314 A1 | 7/2014 | Bhattacharjee et al. |
| 2014/0252567 A1 | 9/2014 | Carroll et al. |
| 2016/0079137 A1 | 3/2016 | Leipold et al. |
| 2016/0126929 A1* | 5/2016 | Leipold ............... H01F 17/0006 333/132 |

OTHER PUBLICATIONS

Notice of Allowance for U.S. Appl. No. 14/885,243, dated Aug. 31, 2016, 8 pages.
Author Unknown, "96% Alumina, thick-film, as fired," MatWeb, Date Unknown, dated accessed Apr. 6, 2016, 2 pages, http://www.matweb.com/search/DataSheet.aspx?MatGUID=3996a734395a4870a9739076918c4297&ckck=1.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Non-Final Office Action for U.S. Appl. No. 14/885,202, dated Apr. 14, 2016, 5 pages.

* cited by examiner ns 25 includes a resonator inductor L_R and a resonator

ANTENNA IMPEDANCE MATCHING AND APERTURE TUNING CIRCUITRY

RELATED APPLICATIONS

This application claims the benefit of U.S. provisional patent application No. 62/074,429, filed Nov. 3, 2014, the disclosure of which is incorporated herein by reference in its entirety.

FIELD OF THE DISCLOSURE

The present disclosure relates to antenna impedance matching circuitry, antenna aperture tuning circuitry, and power coupler circuitry. Specifically, the present disclosure relates to antenna impedance matching circuitry, antenna aperture tuning circuitry, and power coupler circuitry including weakly coupled resonators.

BACKGROUND

Modern wireless communications standards require radio frequency (RF) communications circuitry to be capable of transmitting and receiving wireless signals over a wide frequency range. A fixed antenna can generally only transmit and receive signals efficiently within a relatively narrow frequency range. Accordingly, tunable antennas, antenna tuning circuitry, antenna impedance matching circuitry, and feedback mechanisms are often used to increase the frequency range over which an antenna can efficiently transmit and receive signals. FIG. 1 shows conventional antenna aperture tuning circuitry 10. For context, a radiating antenna element 12 and an antenna feed point 14 are also shown. The conventional antenna aperture tuning circuitry 10 includes a number of resonators 16 coupled between the radiating antenna element 12 and ground. Each one of the resonators 16 includes a resonator inductor L_R and a resonator capacitor C_R. The resonant frequency of each one of the resonators 16 determines the resonant response of the radiating antenna element 12, which affects the transmission and reception quality thereof at different frequencies. Signals received at the radiating antenna element 12 are provided to the antenna feed point 14, which is used to connect the radiating antenna element 12 to additional circuitry. Similarly, signals from the antenna feed point 14 are radiated from the radiating antenna element 12 for transmission.

While the conventional antenna aperture tuning circuitry 10 is capable of tuning the radiating antenna element 12 for a number of different frequencies, the bandwidth of the conventional antenna aperture tuning circuitry 10 is limited. That is, while the conventional antenna aperture tuning circuitry 10 may be capable of tuning a response of the radiating antenna element 12, the width of the pass-band (i.e., the bandwidth) thereof is generally directly proportional to the number of resonators used. Conventional antenna aperture tuning circuitry 10 may require a separate resonator for each operating band that is supported. This may in turn require a large number of inductors and capacitors, which consume a large amount of space in a mobile device and increase the cost thereof, and complex control circuitry for switching in and out these inductors and capacitors.

Antenna impedance matching circuitry is generally used along with antenna aperture tuning circuitry in order to further increase the performance of an RF communications device. In particular, antenna impedance matching circuitry is provided between an antenna and downstream circuitry such as RF front end circuitry in order to match an impedance between the antenna and the downstream circuitry. There are many well-known antenna impedance matching circuit topologies, most or all of which suffer from the same problems above of relatively narrow bandwidth and marginal performance.

FIG. 2 thus shows conventional RF front end circuitry 18 including antenna impedance tuning circuitry. The conventional RF front end circuitry 18 includes an antenna 20, RF multiplexer circuitry 22, and antenna impedance tuning circuitry 24 coupled between the antenna 20 and the RF multiplexer circuitry 22. The antenna impedance tuning circuitry 24 includes a number of resonators 25 coupled between the signal path between the antenna 20 and the multiplexer circuitry 22 and ground. Each one of the resonators 25 includes a resonator inductor L_R and a resonator capacitor C_R coupled in parallel. The resonant frequency of each resonator is relatively narrow, and therefore a bandwidth of the antenna impedance tuning circuitry 24 is limited. While additional resonators may be added to increase the bandwidth of the antenna impedance tuning circuitry 24, doing so comes at the cost of increased space, cost, and complexity.

In a further effort to meet the stringent requirements of many modern wireless communications standards, feedback mechanisms have widely been implemented in order to dynamically adjust signals provided from a wireless communications device. FIG. 3 thus shows conventional power coupler circuitry 26, which may be used to implement one or more such feedback mechanisms. For context, an antenna 27, a transmission line 28, and the RF multiplexer circuitry 22 coupled to the antenna 27 via the transmission line 28 are also shown. The power coupler circuitry 26 includes a power coupler 30 and a termination impedance Z_T. The power coupler 30 includes an isolated node 32, a coupled node 34, and a coupling line 36 between the isolated node 32 and the coupled node 34. The termination impedance Z_T is coupled between the isolated node 32 and ground.

In operation, a portion of electromagnetic power on the transmission line 28 is coupled into the coupling line 36 of the power coupler 30. The amount and type of electromagnetic power coupled from the transmission line 28 to the coupling line 36 is determined by the termination impedance Z_T. The signals on the coupling line 36 are provided to the coupled node 34, where they may be used to dynamically adjust one or more parameters of the RF front end circuitry 18.

FIG. 4 shows the power coupler circuitry 26 wherein the termination impedance Z_T is replaced by an LC resonator 38. The LC resonator 38 includes a resonator inductor L_R and a resonator capacitor C_R coupled in parallel between the isolated node 32 and ground. The resonant frequency of the LC resonator 38 determines a response of the power coupler circuitry 26 on the transmission line 28. In particular, at the resonant frequency of the LC resonator 38, the impedance presented at the isolated node 32 is essentially an open circuit, while at all other frequencies the impedance presented at the isolated node 32 is significantly reduced. This provides good coupling at one frequency, but relatively poor coupling at all other frequencies.

FIG. 5 shows the power coupler circuitry 26 including an additional power coupler 40 and an additional LC resonator 42. The additional power coupler 40 and the additional LC resonator 42 are identical to those described in FIG. 2, such that the additional power coupler 40 includes an isolated node 44, a coupled node 46, and a coupling line 48 between the isolated node 44 and the coupled node 46. The additional LC resonator 42 includes a resonator inductor L_R and a resonator capacitor C_R coupled in parallel between the isolated node 44 and ground. In operation, the LC resonator 38 is tuned to resonate at a first frequency, while the additional LC resonator 42 is tuned to resonate at a second and different frequency. The different resonant frequencies of the LC resonator 38 and the additional LC resonator 42 combine to effectively double the bandwidth of the antenna (either contiguously or non-contiguously). Accordingly, the power coupler circuitry 26 may be used to sense signals within a wider frequency range. However, using the additional LC resonator 42 comes at the cost of significantly increased area, cost, and complexity of the RF front end circuitry 18.

In light of the above, there is a need for antenna aperture tuning circuitry, antenna impedance matching circuitry, and power coupler circuitry with improved performance. In particular, there is a need for antenna aperture tuning circuitry and antenna impedance matching circuitry configured to increase the usable bandwidth of an antenna with reduced complexity and distortion. Additionally, there is a need for compact power coupler circuitry that is usable over a large bandwidth.

SUMMARY

In one embodiment, antenna aperture tuning circuitry includes a first signal path and a second signal path coupled in parallel between an antenna radiating element and ground. A first LC resonator and a second LC resonator are each coupled between the first signal path and ground. The first LC resonator and the second LC resonator are electromagnetically coupled such that a coupling factor between the first LC resonator and the second LC resonator is between about 1.0% and 40.0%. A third LC resonator and a fourth LC resonator are each coupled between the second signal path and ground. The third LC resonator and the fourth LC resonator are electromagnetically coupled such that a coupling factor between the third LC resonator and the fourth LC resonator is between about 1.0% and 40.0%. By providing the first signal path and the second signal path including the resonators that are electromagnetically coupled to one another, the bandwidth of the antenna aperture tuning circuitry is increased, thereby allowing the antenna aperture tuning circuitry to simultaneously tune the antenna radiating element to two different operating bands.

In one embodiment, power coupler circuitry includes a power coupler and a resonator network. The power coupler is configured to couple a portion of electromagnetic power from a transmission line coupled to an antenna, and includes an isolated node, a coupled node, and a coupling line between the isolated node and the coupled node. The resonator network is coupled to the isolated node and includes a first LC resonator and a second LC resonator. The first LC resonator is coupled between the isolated node and ground. The second LC resonator is also coupled between the isolated node and ground. The first LC resonator and the second LC resonator are electromagnetically coupled such that a coupling factor between the first LC resonator and the second LC resonator is between about 1.0% and 40.0%. By providing the first LC resonator and the second LC resonator and coupling them as described above, the power coupler circuitry may be simultaneously tuned to two different operating bands, which allows the power coupler to simultaneously obtain high quality coupled signals within the two different operating bands at the coupled node.

In one embodiment, multiplexer and antenna impedance matching circuitry includes a first signal path coupled between an antenna node and a first input/output node, and a second signal path coupled in parallel with the first signal path between the antenna node and a second input/output node. A first LC resonator and a second LC resonator are each coupled between the first signal path and ground. The first LC resonator and the second LC resonator are electromagnetically coupled such that a coupling factor between the first LC resonator and the second LC resonator is between about 1.0% and 40.0%. A third LC resonator and a fourth LC resonator are each coupled between the second signal path and ground. The third LC resonator and the fourth LC resonator are electromagnetically coupled such that a coupling factor between the third LC resonator and the fourth LC resonator is between about 1.0% and 40.0%. The multiplexer and antenna impedance matching circuitry is configured to pass signals within a first frequency band between the first input/output node and the antenna node while attenuating signals outside of the first frequency band along the first signal path. Further, the multiplexer and antenna impedance matching circuitry is configured to pass signals within a second frequency band between the second input/output node and the antenna node while attenuating signals outside of the second frequency band along the second signal path. Finally, the multiplexer and antenna impedance tuning circuitry is configured to match an impedance presented at the antenna node to an impedance presented at one or more of the first input/output node and the second input/output node.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
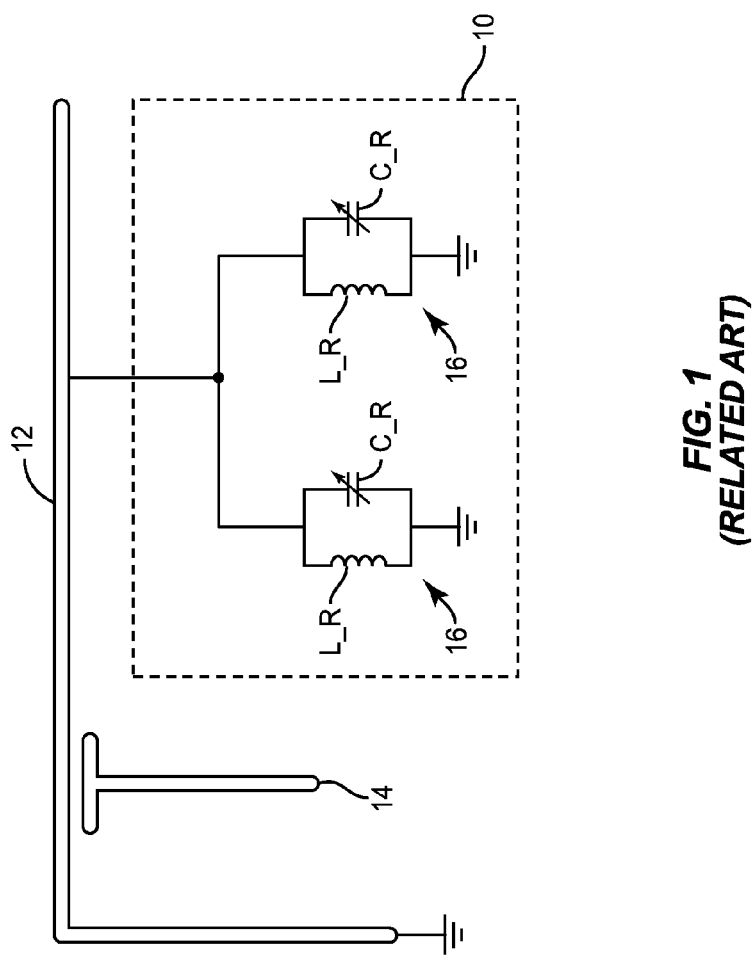
FIG. 1 shows a functional schematic of conventional antenna aperture tuning circuitry.
Figure 2:
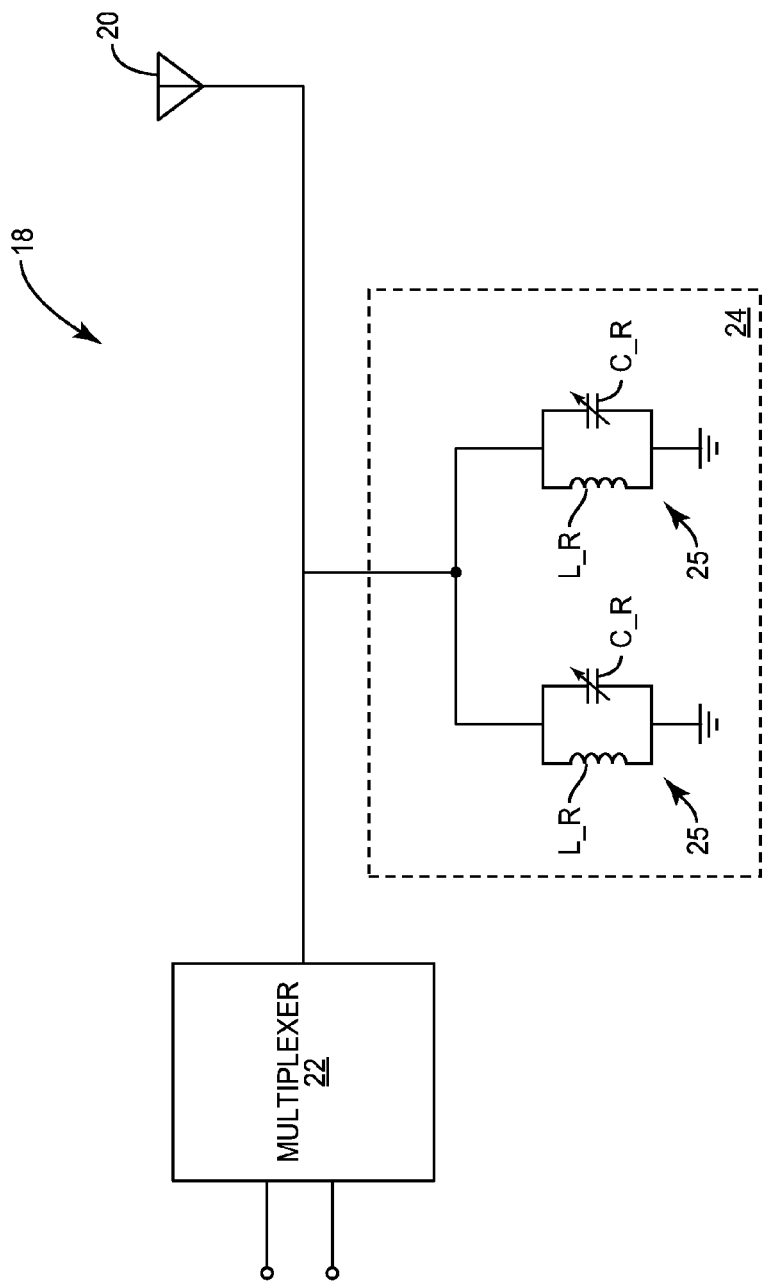
FIG. 2 shows a functional schematic of conventional radio frequency (RF) front end circuitry.
Figure 3:
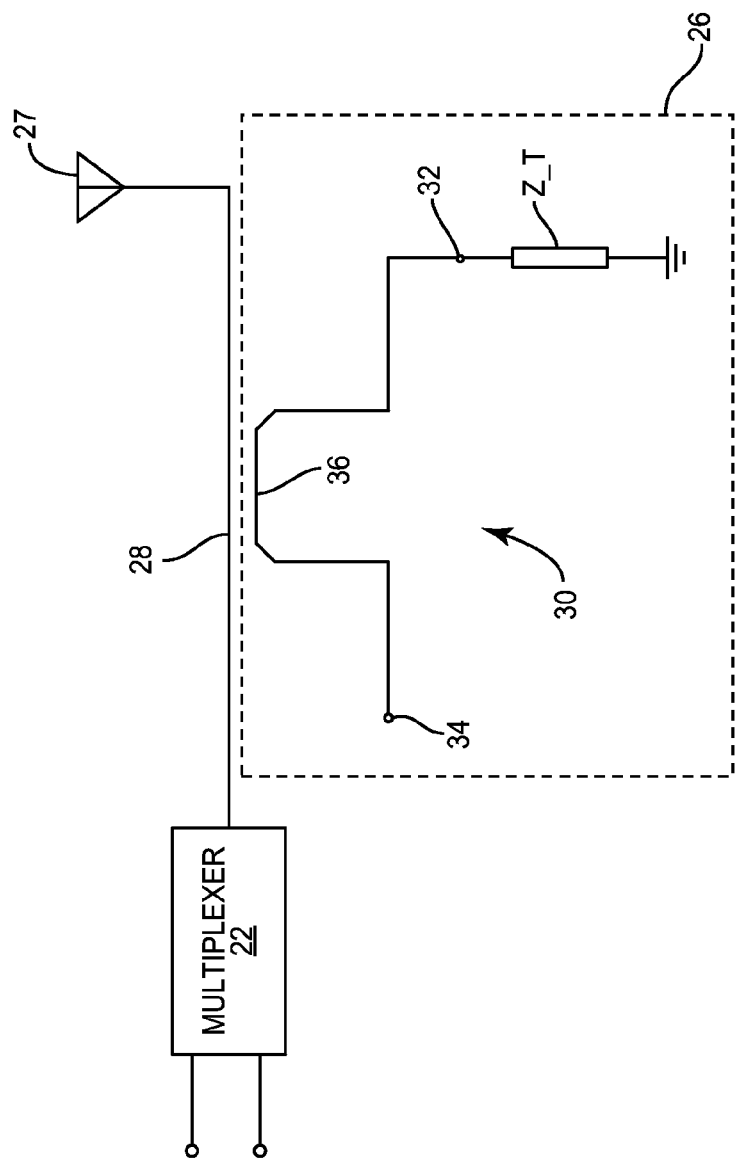
FIG. 3 shows a functional schematic of conventional power coupler circuitry.
Figure 4:
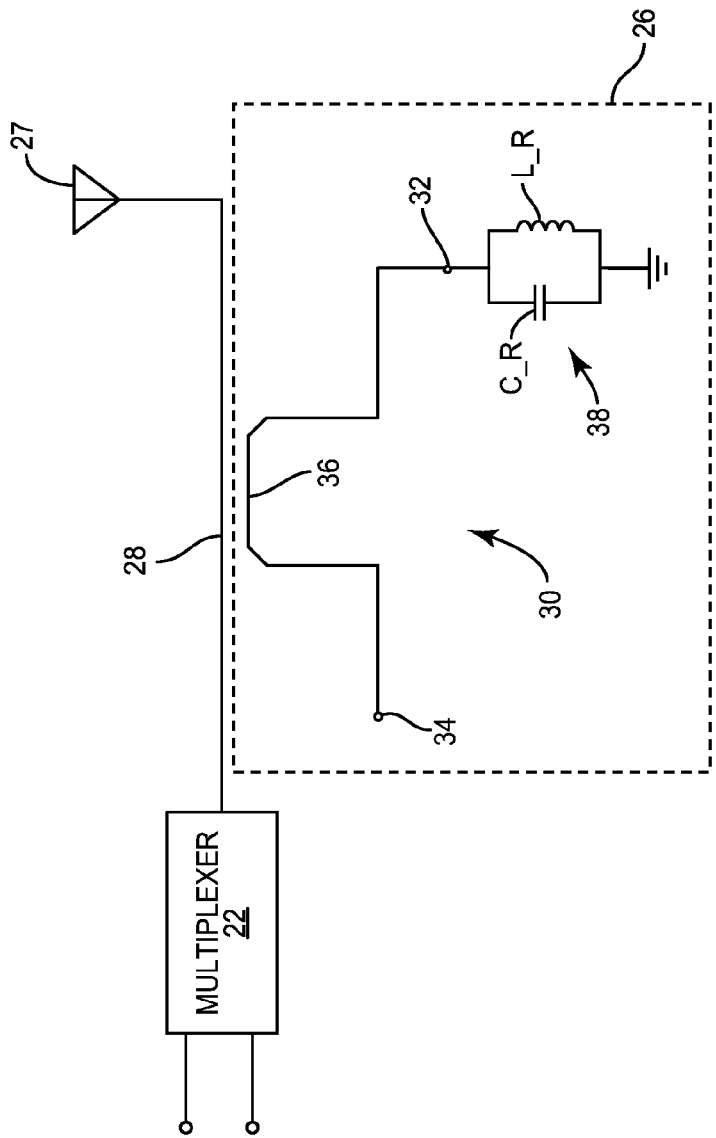
FIG. 4 shows a functional schematic of conventional power coupler circuitry.
Figure 5:
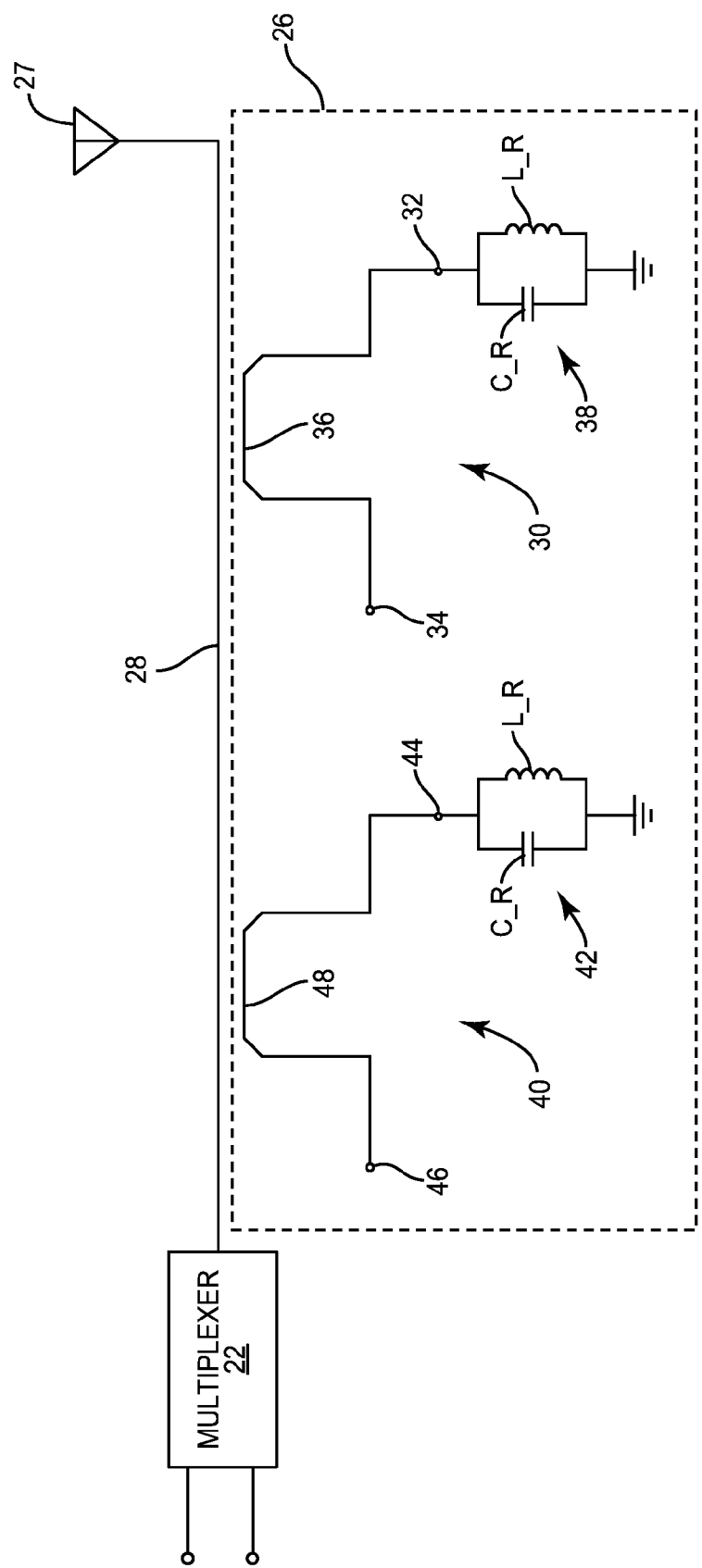
FIG. 5 shows a functional schematic of conventional power coupler circuitry.
Figure 6:
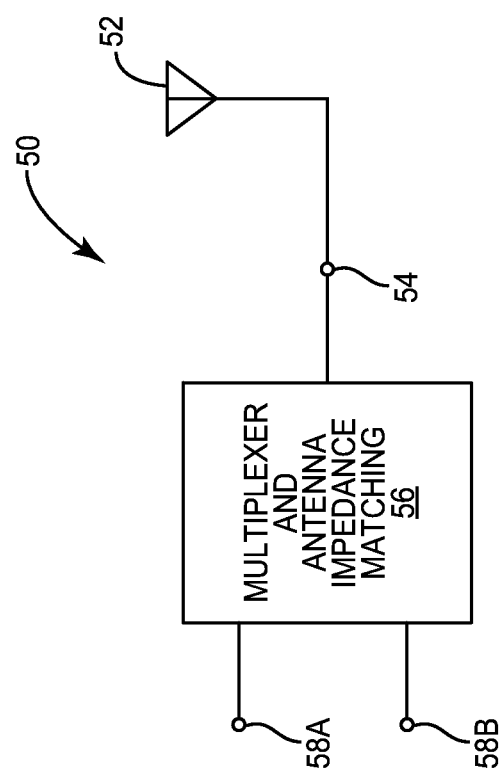
FIG. 6 shows a functional schematic of RF front end circuitry according to one embodiment of the present disclosure.

FIG. 6 shows radio frequency (RF) front end circuitry 50 according to one embodiment of the present disclosure. The RF front end circuitry 50 includes an antenna 52 coupled to an antenna node 54, and combined multiplexer and antenna impedance matching circuitry 56 coupled between a number of input/output nodes 58 (shown individually as 58A and 58B) and the antenna node 54. The combined multiplexer and antenna impedance matching circuitry 56 is configured to separate RF receive signals from the antenna 52 into a number of separate bands (determined by the order of the multiplexer), delivering the separated signals to a respective one of the input/output nodes 58. Further, the combined multiplexer and antenna impedance matching circuitry 56 is configured to match an impedance at the input/output nodes 58 to an impedance of the antenna 52. Such a configuration not only allows for tuning of the antenna impedance for multiple operating bands, but also reduces insertion loss in the signal path of the antenna 52 due to the fact that separate antenna impedance matching circuitry is not used. In other words, by combining the functionality of a multiplexer and antenna impedance matching circuitry into the same circuitry, the overall number of components used can be reduced, which in turn reduces insertion loss and improves performance.

Figure 7:
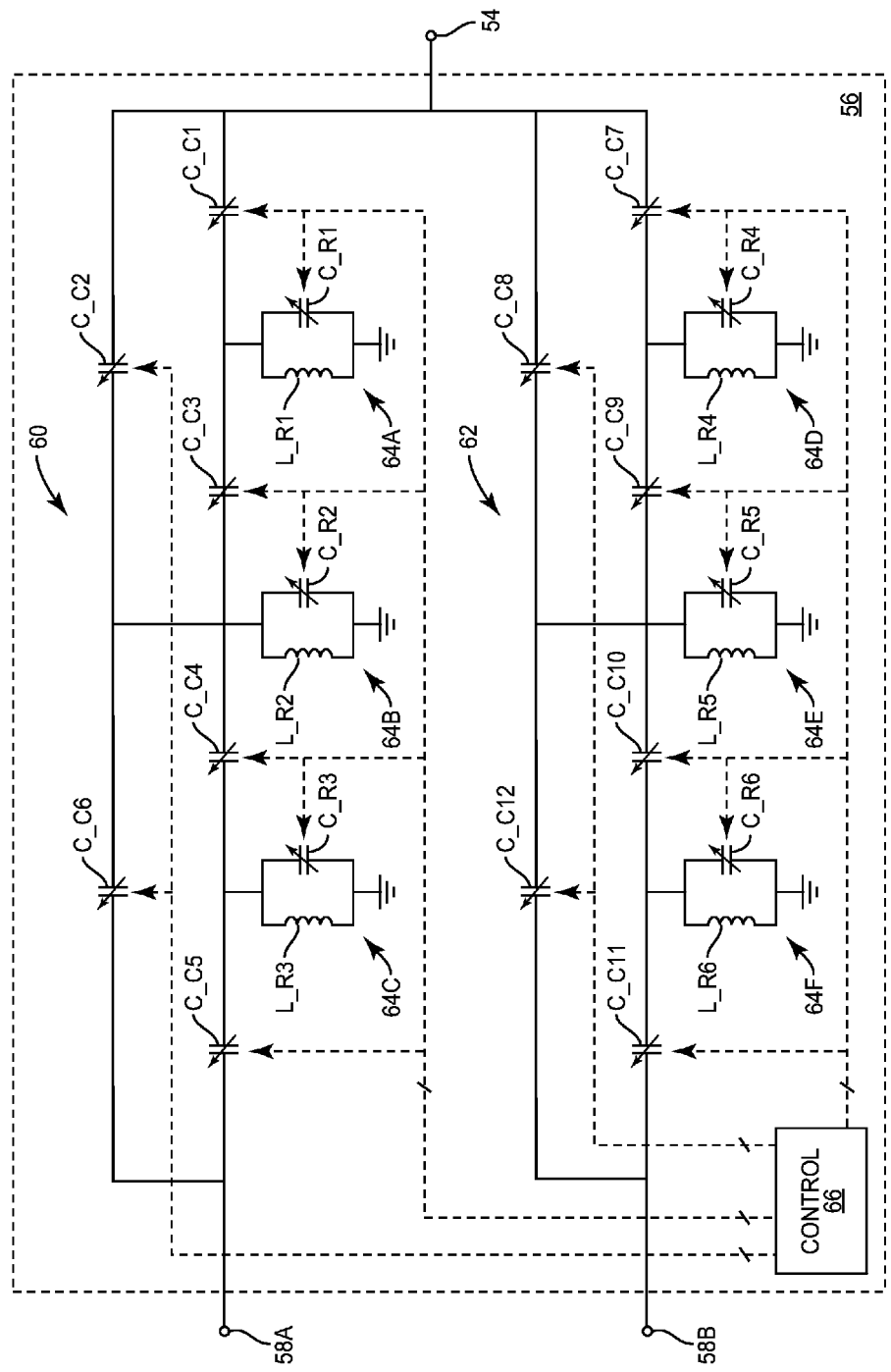
FIG. 7 shows a functional schematic of combined multiplexer and antenna tuning circuitry according to one embodiment of the present disclosure.

FIG. 7 shows details of the combined multiplexer and antenna impedance matching circuitry 56 according to one embodiment of the present disclosure. The combined multiplexer and antenna impedance matching circuitry 56 includes a first signal path 60 coupled between the first input/output node 58A and the antenna node 54 and a second signal path 62 coupled between the second input/output node 58B and the antenna node 54. The first signal path 60 includes a first resonator 64A, a second resonator 64B, and a third resonator 64C, each coupled between the first signal path 60 and ground. The first resonator 64A includes a first resonator capacitor C_R1 and a first resonator inductor first resonator inductor L_R1 coupled in parallel between the first signal path 60 and ground. The second resonator 64B includes a second resonator capacitor C_R2 and a second resonator inductor second resonator inductor L_R2 coupled in parallel between the first signal path 60 and ground. The third resonator 64C includes a third resonator capacitor C_R3 and a third resonator inductor L_R3 coupled in parallel between the first signal path 60 and ground.

A first coupling capacitor C_C1 is coupled between the antenna node 54 and the first resonator 64A, a second coupling capacitor C_C2 is coupled between the antenna node 54 and the second resonator 64B, a third coupling capacitor C_C3 is coupled between the first resonator 64A and the second resonator 64B, a fourth coupling capacitor C_C4 is coupled between the second resonator 64B and the third resonator 64C, a fifth coupling capacitor C_C5 is coupled between the third resonator 64C and the first input/output node 58A, and a sixth coupling capacitor C_C6 is coupled between the second resonator 64B and the first input/output node 58A.

The second signal path 62 includes a fourth resonator 64D, a fifth resonator 64E, and a sixth resonator 64F, each coupled between the second signal path 62 and ground. The fourth resonator 64D includes a fourth resonator capacitor C_R4 and a fourth resonator inductor L_R4 coupled in parallel between the second signal path 62 and ground. The fifth resonator 64E includes a fifth resonator capacitor C_R5 and a fifth resonator inductor L_R5 coupled in parallel between the second signal path 62 and ground. The sixth resonator 64F includes a sixth resonator capacitor C_R6 and a sixth resonator inductor L_R6 coupled in parallel between the second signal path 62 and ground. A seventh coupling capacitor C_C7 is coupled between the antenna node 54 and the fourth resonator 64D, an eighth coupling capacitor C_C8 is coupled between the antenna node 54 and the fifth resonator 64E, a ninth coupling capacitor C_C9 is coupled between the fourth resonator 64D and the fifth resonator 64E, a tenth coupling capacitor C_C10 is coupled between the fifth resonator 64E and the sixth resonator 64F, an eleventh coupling capacitor C_C11 is coupled between the sixth resonator 64F and the second input/output node 58B, and a twelfth coupling capacitor C_C12 is coupled between the fifth resonator 64E and the second input/output node 58B.

Resonator control circuitry 66 is coupled to each resonator capacitor C_R in the first resonator 64A, the second resonator 64B, the third resonator 64C, the fourth resonator 64D, the fifth resonator 64E, and the sixth resonator 64F. Further, the resonator control circuitry 66 is coupled to each coupling capacitor in the combined multiplexer and antenna impedance matching circuitry 56. In operation, these capacitances are tuned to provide a desired resonant frequency of the first resonator 64A, the second resonator 64B, the third resonator 64C, the fourth resonator 64D, and the fifth resonator 64E. Further, the capacitances are tuned to provide a desired coupling factor between the resonators, such that a coupling factor between the first resonator 64A and the second resonator 64B is between about 1.0% and 40.0% (i.e., between about 0.01 and 0.4), a coupling factor between the first resonator 64A and the fourth resonator 64D is between about 1.0% and 40.0% (i.e., between about 0.01 and 0.4), a coupling factor between the second resonator 64B and the third resonator 64C is between about 1.0% and 40.0% (i.e., between about 0.01 and 0.4), a coupling factor between the second resonator 64B and the fifth resonator 64E is less than about 1.0%, a coupling factor between the third resonator 64C and the sixth resonator 64F is less than about 1.0%, a coupling factor between the fourth resonator 64D and the fifth resonator 64E is between about 1.0% and 40.0% (i.e., between about 0.01 and 0.4), and a coupling factor between the fifth resonator 64E and the sixth resonator 64F is between about 1.0% and 40.0% (i.e., between about 0.01 and 0.4).

Each resonator 62 may be configured to resonate at a different frequency. By tuning the capacitances as described above to produce the desired coupling between the resonators and a desired resonant frequency of each resonator, the bandwidth of the resonant response and the quality factor (Q) of the combined multiplexer and antenna impedance matching circuitry 56 may be increased, thereby allowing the RF front end circuitry 50 to support the simultaneous transmission and/or reception of multiple operating bands with less circuitry and less insertion loss than conventional approaches. In operation, the combined resonant response of the first resonator 64A, the second resonator 64B, and the third resonator 64C is configured to pass signals within a first frequency band between the antenna node 54 and the first input/output node 58A, while attenuating other signals. The combined resonant response of the fourth resonator 64D, the fifth resonator 64E, and the sixth resonator 64F is configured to pass signals within a second frequency band between the antenna node 54 and the second input/output node 58B, while attenuating other signals. Further, the resonant response of the first resonator 64A, the second resonator 64B, the third resonator 64C, the fourth resonator 64D, and the fifth resonator 64E is configured to match the impedance at the output of the combined multiplexer and antenna impedance matching circuitry 56 with the impedance presented by the antenna 52 in order to minimize a voltage standing wave ratio (VSWR) in the RF front end circuitry 50. As discussed above, combining these functions into a single resonator network results in less insertion loss and improved performance. Specifically, using the combined multiplexer and antenna impedance matching circuitry 56 may forego the need for separate antenna impedance tuning circuitry, which may significantly reduce insertion loss. Further, using resonators that are coupled to one another as discussed above increases the bandwidth and quality factor (Q) of the resonator network.

Figure 8:
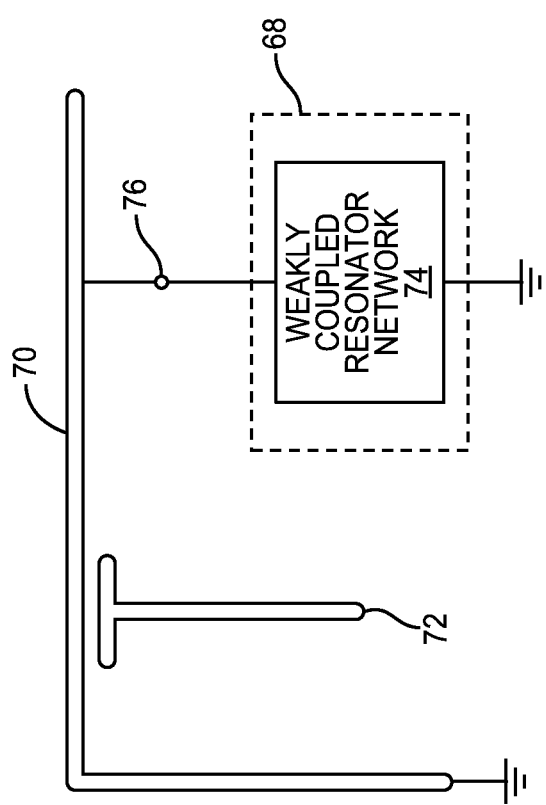
FIG. 8 shows a functional schematic of antenna aperture tuning circuitry according to one embodiment of the present disclosure.

In addition to impedance transformation, the principles of the present disclosure may also be applied to antenna aperture tuning. Accordingly, FIG. 8 shows an antenna aperture tuning circuitry 68 according to one embodiment of the present disclosure. A radiating antenna element 70 and an antenna feedpoint 72 are shown for context. The antenna aperture tuning circuitry 68 includes a weakly coupled resonator network 74 coupled between a resonator network input node 76 and ground. The resonator network input node 76 is coupled to the radiating antenna element 70. The weakly coupled resonator network 74 includes at least a first LC resonator and a second LC resonator (not shown), which are weakly coupled to one another such that a coupling factor between the first LC resonator and the second LC resonator is between about 1.0% and 40.0% (i.e., between about 0.01 and 0.4). The particular details of the weakly coupled resonator network 72 are discussed below. Using the weakly coupled resonator network 74 results in increased bandwidth and quality factor (Q) when compared to conventional resonator circuitry, which provides a more desirable resonant response and improves the performance of the antenna aperture tuning circuitry 68 as discussed below.

In operation, a resonant response of the weakly coupled resonator network 74 is tuned as desired. The resonant response of the weakly coupled resonator network 74 in turn determines the radiating response of the radiating antenna element 70. Accordingly, the aperture of the radiating antenna element 70 may be tuned to a desired frequency or frequencies. As discussed below, the weakly coupled resonator network 74 provides high quality factor (Q) and bandwidth, which allows the radiating antenna element 70 to be precisely and simultaneously tuned to multiple operating bands for purposes of carrier aggregation. Using the coupling factors described above, a quality factor of the weakly coupled resonator network 74 may be between about 10 and 500, and a total bandwidth of the weakly coupled resonator network 74 may be between about 1.0% and 50.0% of the center frequency of the network (fractional bandwidth). For a given frequency range the center frequency is in between the minimum frequency and the maximum frequency. In one embodiment, the center frequency is calculated using an arithmetic average. In another embodiment, the center frequency is coupled using a geometric average.

Figure 9:
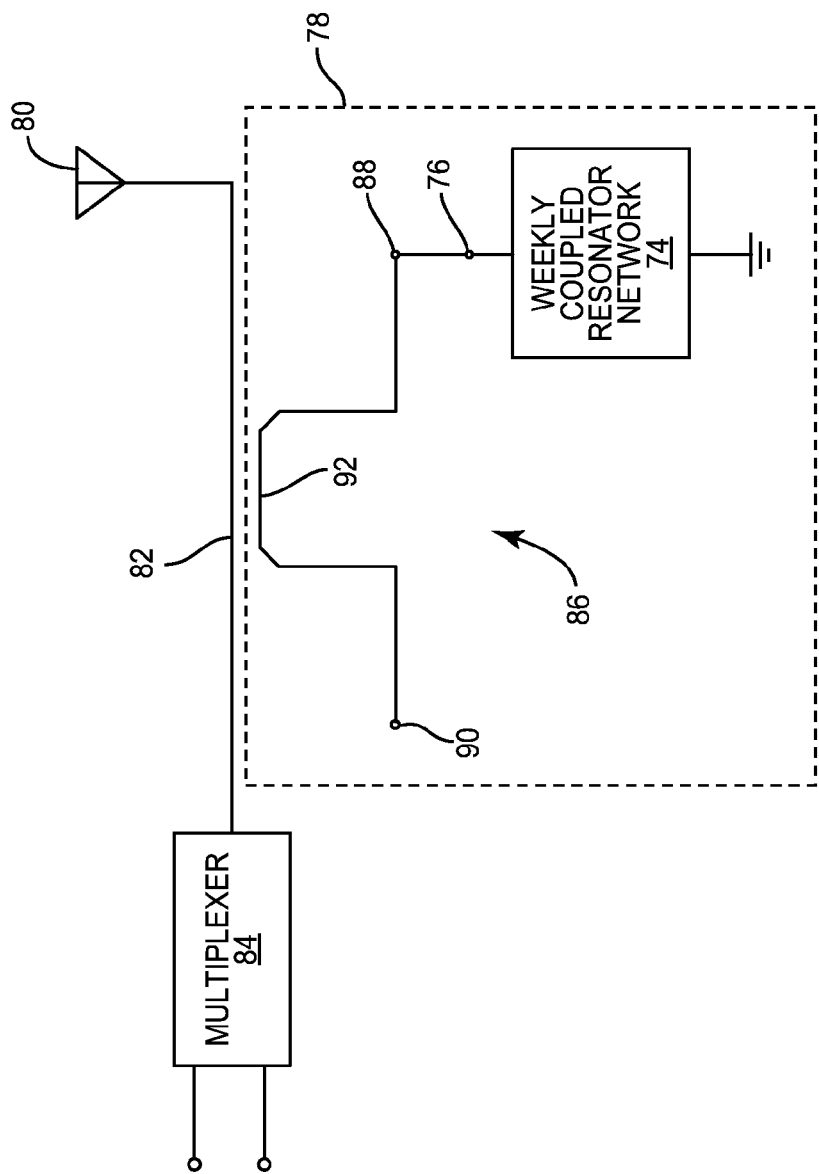
FIG. 9 shows a functional schematic of power coupling circuitry according to one embodiment of the present disclosure.

The principles of the present disclosure may also apply to power coupler circuitry. Accordingly, FIG. 9 shows power coupler circuitry 78 according to one embodiment of the present disclosure. For context, an antenna 80, a transmission line 82, and RF multiplexer circuitry 84 coupled to the antenna 80 via the transmission line 82 are also shown. The power coupler circuitry 78 includes a power coupler 86 and the weakly coupled resonator network 74. The power coupler 86 includes an isolated node 88, a coupled node 90, and a coupling line 92 coupled between the isolated node 88 and the coupled node 90. The weakly coupled resonator network 74 is coupled between the resonator network input node 76 and ground. The resonator network input node 76 is coupled to the isolated node 88 of the power coupler 86. The weakly coupled resonator network 74 includes at least a first LC resonator and a second LC resonator (not shown), which are coupled to one another such that a coupling factor between the first LC resonator and the second LC resonator is between about 1.0% and 40.0% (i.e., between about 0.01 and 0.4). The particular details of the weakly coupled resonator network 74 are discussed below. Using the weakly coupled resonator network 74 results in an increased quality factor (Q) when compared to conventional resonator circuitry, which provides a more desirable resonant response and improves the performance of the power coupler circuitry 78 as discussed below.

In operation, a portion of electromagnetic power on the transmission line 82 is coupled into the coupling line 92 of the power coupler 86. The amount and type of electromagnetic power coupled from the transmission line 82 to the power coupler 86 is determined by the weakly coupled resonator network 74. As discussed below, using the weakly coupled resonator network 74 allows the power coupler circuitry 78 to effectively couple signals for feedback over a wide range of frequencies. In particular, using the weakly coupled resonator network 74 may provide a quality factor (Q) between about 10 and 500 and a total bandwidth between about 1.0% and 50.0% of the center frequency (fractional bandwidth), which may allow the power coupler circuitry 78 to provide high quality coupled signals over a wide variety of frequencies such that the power coupler circuitry 78 is highly directive.

Figure 10:
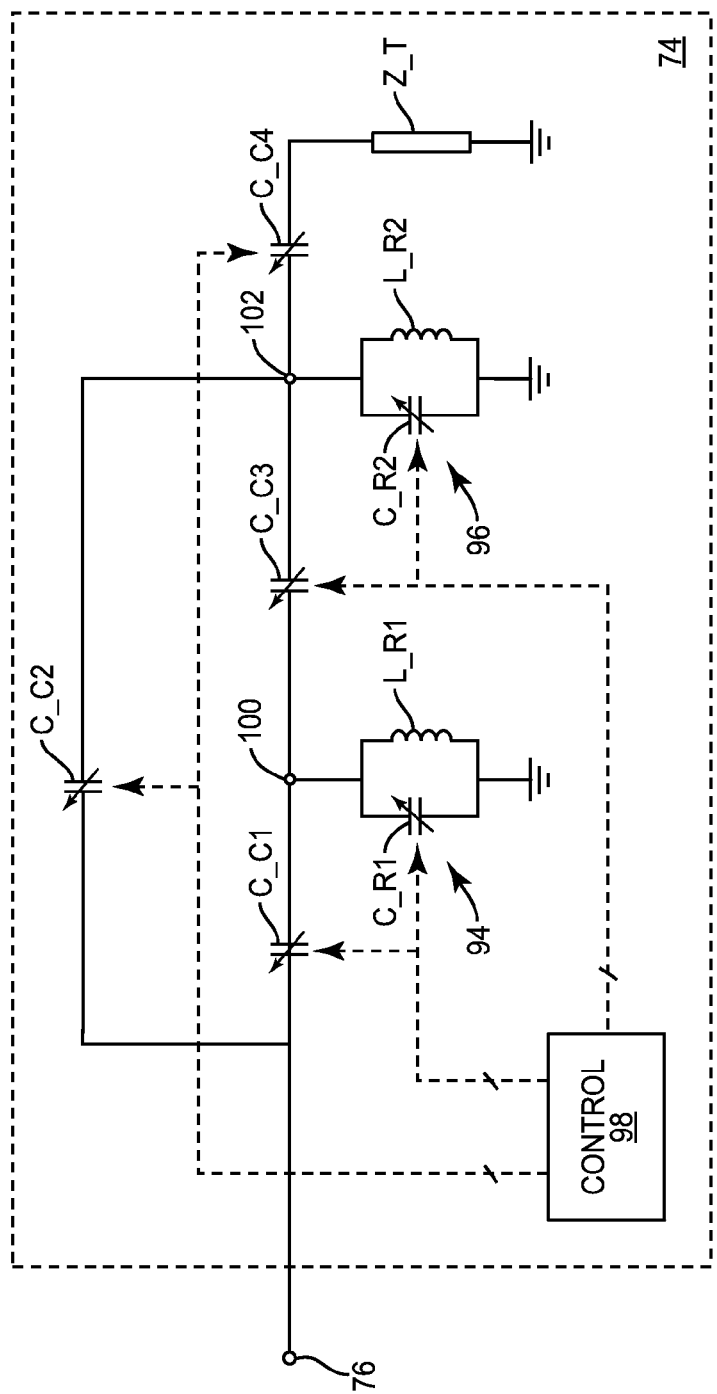
FIG. 10 shows a functional schematic of a weakly coupled resonator network according to one embodiment of the present disclosure.

FIG. 10 shows details of the weakly coupled resonator network 74 according to one embodiment of the present disclosure. The weakly coupled resonator network 74 includes a first LC resonator 94 coupled between the resonator network input node 76 and ground, a second LC resonator 96 coupled in parallel with the first LC resonator 94 between the resonator network input node 76 and ground, and resonator control circuitry 98 coupled to the first LC resonator 94 and the second LC resonator 96. The first LC resonator 94 includes a first resonator capacitor $C\_R1$ and a first resonator inductor first resonator inductor $L\_R1$ coupled in parallel between a first common node 100 and ground. The second LC resonator 96 includes a second resonator capacitor C_R2 and a second resonator inductor second resonator inductor L_R2 coupled in parallel between a second common node 102 and ground. A first coupling capacitor C_C1 is coupled between the resonator network input node 76 and the first common node 100. A second coupling capacitor C_C2 is coupled between the resonator network input node 76 and the second common node 102. A third coupling capacitor C_C3 is coupled between the first common node 100 and the second common node 102. An optional termination impedance Z_T may be coupled to the second common node 102 via a fourth coupling capacitor C_C4.

The first resonator capacitor C_R1, the second resonator capacitor C_R2, the first coupling capacitor C_C1, the second coupling capacitor C_C2, the third coupling capacitor C_C3, and the fourth coupling capacitor C_C4 may each be adjustable capacitors. For example, the first resonator capacitor C_R1, the second resonator capacitor C_R2, the first coupling capacitor C_C1, the second coupling capacitor C_C2, the third coupling capacitor C_C3, and the fourth coupling capacitor C_C4 may each be varactors or digitally controlled capacitor arrays. The resonator control circuitry 98 is coupled to the first resonator capacitor C_R1, the second resonator capacitor C_R2, the first coupling capacitor C_C1, the second coupling capacitor C_C2, the third coupling capacitor C_C3, and the fourth coupling capacitor C_C4 in order to adjust the capacitance thereof. By adjusting the capacitance of the first resonator capacitor C_R1, the second resonator capacitor C_R2, the first coupling capacitor C_C1, the second coupling capacitor C_C2, the third coupling capacitor C_C3, and the fourth coupling capacitor C_C4, the resonator control circuitry 98 can adjust a resonant frequency of the first LC resonator 94 and the second LC resonator 96 as well as a coupling factor between the two. In general, the resonator control circuitry 98 is configured to adjust the first resonator capacitor C_R1, the second resonator capacitor C_R2, the first coupling capacitor C_C1, the second coupling capacitor C_C2, the third coupling capacitor C_C3, and the fourth coupling capacitor C_C4 such that a coupling factor between the first LC resonator 94 and the second LC resonator 96 remains between about 1.0% and 40.0% (i.e., between about 0.01 and 0.4).

As discussed above, the resonant response of the weakly coupled resonator network 74 determines the radiating response of the radiating antenna element 70 when used in the antenna aperture tuning circuitry 68. Further, the resonant response of the weakly coupled resonator network 74 determines the coupling between the power coupler circuitry 78 and the transmission line 82. Each one of the first LC resonator 94 and the second LC resonator 96 is tuned to a specific resonant frequency, which provides a pole or peak in the resonant response of the weakly coupled resonator network 74. Generally, these peaks are provided about a desired operating band or bands in order to improve the transmission or reception characteristics of the antenna 80 at these operating band(s). For carrier aggregation purposes, the resonant frequency of the first LC resonator 94 may be set at or around a first low-band, mid-band, or high-band frequency, while the resonant frequency of the second LC resonator 96 may be set at or around a second low-band, mid-band, or high-band frequency that is either contiguous or non-contiguous with the first frequency. Accordingly, the antenna 80 can be simultaneously tuned at two frequencies, which may enable the simultaneous transmission and/or reception of signals about two different operating bands. As will be appreciated by those skilled in the art, low-band signals include RF signals between 800 MHz and 1 GHz, mid-band signals include RF signals between 1.7 GHz and 2 GHz, and high-band signals include RF signals between 2.3 GHz and 2.7 GHz.

As will be appreciated by those skilled in the art, providing weak coupling between the first LC resonator 94 and the second LC resonator 96 increases the sharpness of roll-off from the resonant response thereof, and effectively increases the quality factor (Q) of the weakly coupled resonator network 74. Such performance improvements are desirable for obtaining precise tuning of the antenna aperture tuning circuitry 68 and the power coupler circuitry 78. Further, using multiple LC resonators in the weakly coupled resonator network 74 allows the bandwidth of the network to be increased without providing additional power couplers, which decreases the overall complexity and size of the antenna aperture tuning circuitry 68 and the power coupler circuitry 78.

The coupling between the first LC resonator 94 and the second LC resonator 96 may be achieved by providing the first LC resonator 94 and the second LC resonator 96 in proximity to one another on the same substrate or die such that the first resonator inductor first resonator inductor L_R1 and the second resonator inductor second resonator inductor L_R2 experience electromagnetic coupling. The first coupling capacitor C_C1, the second coupling capacitor C_C2, the third coupling capacitor C_C3, and the fourth coupling capacitor C_C4 allow for the adjustment of the coupling between the first LC resonator 94 and the second LC resonator 96.

While the resonator control circuitry 98 is shown in the weakly coupled resonator network 74, the various control signals provided to the first resonator capacitor C_R1, the second resonator capacitor C_R2, the first coupling capacitor C_C1, the second coupling capacitor C_C2, the third coupling capacitor C_C3, and the fourth coupling capacitor C_C4 may similarly be provided by external circuitry such as RF front end circuitry (not shown), baseband circuitry, or any other suitable circuitry. In general, the resonator control circuitry 98 can be any suitable circuitry for providing control signals to the first resonator capacitor C_R1, the second resonator capacitor C_R2, the first coupling capacitor C_C1, the second coupling capacitor C_C2, the third coupling capacitor C_C3, and the fourth coupling capacitor C_C4 in order to adjust the capacitances thereof and thus tune the weakly coupled resonator network 74 as desired. Further, while the various paths from the resonator control circuitry 98 to the various capacitors in the weakly coupled resonator network 74 may be combined to simplify the drawings, each one of the capacitors in the weakly coupled resonator network 74 may be individually and independently controlled in order to provide a desired response thereof.

While only two LC resonators are shown in the weakly coupled resonator network 74 shown in FIG. 10, any number of LC resonators may be provided without departing from the principles of the present disclosure. The coupling factor between the various LC resonators may be the same or different in order to provide a desirable resonant response of the weakly coupled resonator network 74. In general, additional LC resonators may provide additional resonant poles or peaks in the resonant response of the weakly coupled resonator network 74, which may be used to formulate a desired impedance transformation on the transmission line 82 and thus tune the antenna 80 to any desired number of frequencies.

Figure 11:
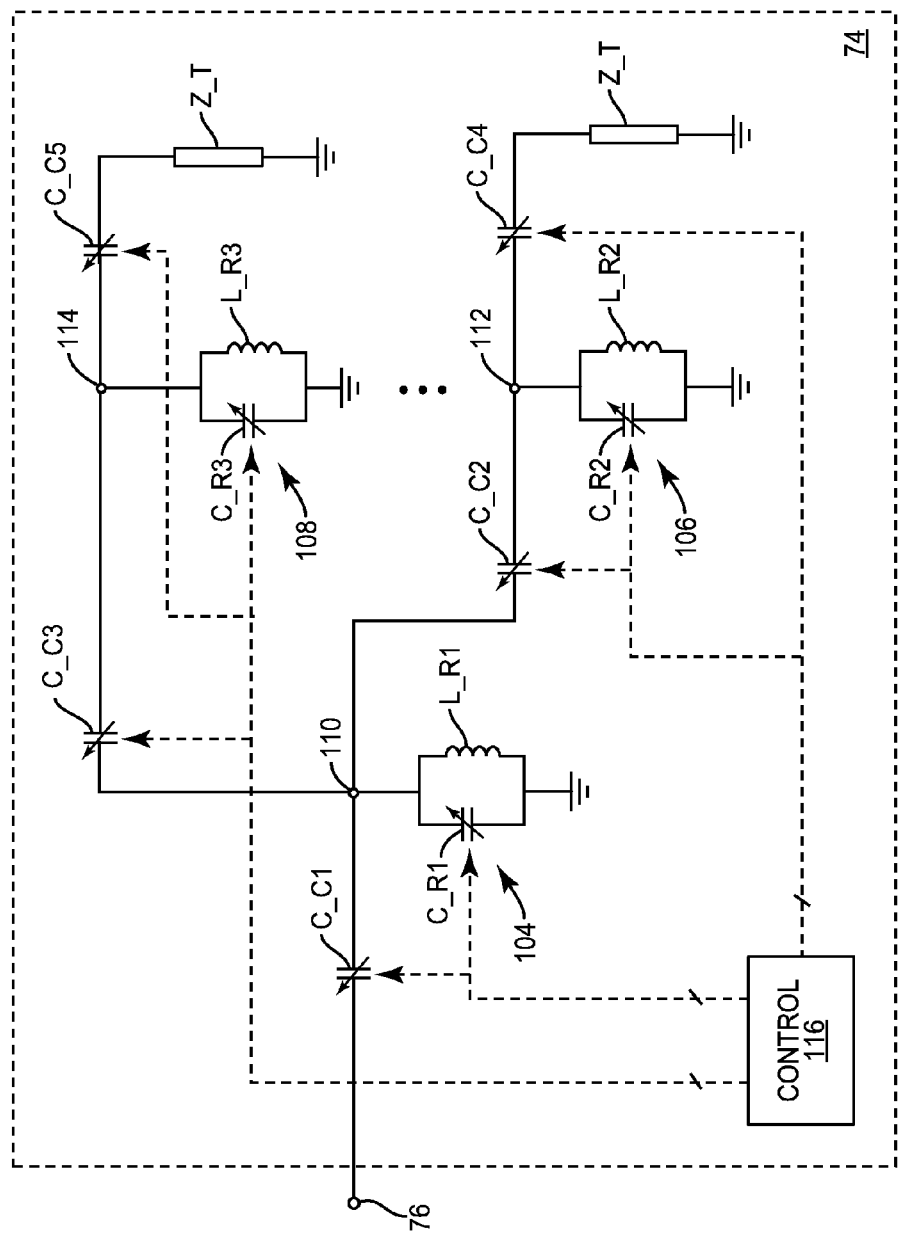
FIG. 11 shows a functional schematic of a weakly coupled resonator network according to one embodiment of the present disclosure.

FIG. 11 shows the weakly coupled resonator network 74 according to an additional embodiment of the present disclosure. The weakly coupled resonator network 74 includes a first LC resonator 104, a second LC resonator 106, and a third LC resonator 108, each coupled between the resonator network input node 76 and ground. The first LC resonator 104 includes a first resonator capacitor C_R1 and a first resonator inductor first resonator inductor L_R1 coupled between a first common node 110 and ground. The second LC resonator 106 includes a second resonator capacitor C_R2 and a second resonator inductor second resonator inductor L_R2 coupled between a second common node 112 and ground. The third LC resonator 108 includes a third resonator capacitor C_R3 and a third resonator inductor L_R3 coupled between a third common node 114 and ground. A first coupling capacitor C_C1 is coupled between the resonator network input node 76 and the first common node 110. A second coupling capacitor C_C2 is coupled between the first common node 110 and the second common node 112. A third coupling capacitor C_C3 is coupled between the first common node 110 and the third common node 114. A first optional termination impedance Z_T is coupled to the second common node 112 via a fourth coupling capacitor C_C4. A second optional termination impedance Z_T is coupled to the third common node 114 via a fifth coupling capacitor C_C5.

The first resonator capacitor C_R1, the second resonator capacitor C_R2, the first coupling capacitor C_C1, the second coupling capacitor C_C2, the third coupling capacitor C_C3, the fourth coupling capacitor C_C4, and the fifth coupling capacitor C_C5 may each be adjustable capacitors. For example, the first resonator capacitor C_R1, the second resonator capacitor C_R2, the first coupling capacitor C_C1, the second coupling capacitor C_C2, the third coupling capacitor C_C3, the fourth coupling capacitor C_C4, and the fifth coupling capacitor C_C5 may each be varactors or digitally controlled capacitor arrays. Resonator control circuitry 116 is coupled to the first resonator capacitor C_R1, the second resonator capacitor C_R2, the first coupling capacitor C_C1, the second coupling capacitor C_C2, the third coupling capacitor C_C3, the fourth coupling capacitor C_C4, and the fifth coupling capacitor C_C5 in order to adjust the capacitance thereof. By adjusting the capacitance of the first resonator capacitor C_R1, the second resonator capacitor C_R2, the first coupling capacitor C_C1, the second coupling capacitor C_C2, the third coupling capacitor C_C3, the fourth coupling capacitor C_C4, and the fifth coupling capacitor C_C5, the resonator control circuitry 116 can adjust a resonant frequency of the first LC resonator 104, the second LC resonator 106, and the third LC resonator 108, as well as the coupling factor between the resonators. In general, the resonator control circuitry 116 is configured to adjust the first resonator capacitor C_R1, the second resonator capacitor C_R2, the first coupling capacitor C_C1, the second coupling capacitor C_C2, the third coupling capacitor C_C3, the fourth coupling capacitor C_C4, and the fifth coupling capacitor C_C5 such that a coupling factor between the first LC resonator 104 and the second LC resonator 106 is between about 1.0% and 40.0% (i.e., between about 0.01 and 0.4), a coupling factor between the first LC resonator 104 and the third LC resonator 108 is between about 1.0% and 40.0% (i.e., between about 0.01 and 0.4), and a coupling factor between the second LC resonator 106 and the third LC resonator 108 is between about 1.0% and 40.0% (i.e., between about 0.01 and 0.4).

The resonant response of the weakly coupled resonator network 74 determines the radiating response of the radiating antenna element 70 when used in the antenna aperture tuning circuitry 68. Further, the resonant response of the weakly coupled resonator network 74 determines coupling achieved by the power coupler circuitry 78. Each one of the first LC resonator 104, the second LC resonator 106, and the third LC resonator 108 is tuned to a specific resonant frequency, which provides a pole or peak in the resonant response of the weakly coupled resonator network 74. Generally, these peaks are provided about a desired operating band or bands in order to improve the transmission or reception characteristics of the antenna radiating element 70 and the coupling characteristics of the power coupler circuitry 78. For carrier aggregation purposes, the resonant frequency of the first LC resonator 104 may be set at or around a first low-band, mid-band, or high-band frequency, the resonant frequency of the second LC resonator 106 may be set at or around a second low-band, mid-band, or high-band frequency, and the resonant frequency of the third LC resonator 108 may be set at or around a third low-band, mid-band, or high-band frequency. The first frequency, the second frequency, and the third frequency may be contiguous or non-contiguous, depending upon the particular carrier aggregation configuration. Accordingly, the radiating antenna element 70 and/or the power coupler circuitry 78 can be simultaneously tuned at two, three, or more frequencies, which may enable simultaneous transmission and/or reception of signals about two, three, or more operating bands.

As will be appreciated by those skilled in the art, providing weak coupling between the first LC resonator 104, the second LC resonator 106, and the third LC resonator 108 increases the sharpness of the roll-off of the resonant response thereof, and effectively increases the Q of the weakly coupled resonator network 74. Such performance improvements may be desirable for obtaining precise tuning of the antenna aperture tuning circuitry 68 and the power coupler circuitry 78. Further, using multiple LC resonators in the weakly coupled resonator network 74 allows the bandwidth of the antenna to be increased without providing additional power couplers, which decreases the overall complexity and size of the power coupler circuitry 78.

The coupling between the first LC resonator 104, the second LC resonator 106, and the third LC resonator 108 may be achieved by providing the first LC resonator 104, the second LC resonator 106, and the third LC resonator 108 in proximity to one another on the same substrate or die such that the first resonator inductor first resonator inductor L_R1, the second resonator inductor second resonator inductor L_R2, and the third resonator inductor L_R3 experience electromagnetic coupling. The first coupling capacitor C_C1, the second coupling capacitor C_C2, and the third coupling capacitor C_C3 allow for the adjustment of the coupling between the first LC resonator 104, the second LC resonator 106, and the third LC resonator 108.

While the resonator control circuitry 116 is shown in the weakly coupled resonator network 74, the various control signals provided to the first resonator capacitor C_R1, the second resonator capacitor C_R2, the first coupling capacitor C_C1, the second coupling capacitor C_C2, the third coupling capacitor C_C3, the fourth coupling capacitor C_C4, and the fifth coupling capacitor C_C5 may similarly be provided by external circuitry such as RF front end circuitry (not shown), baseband circuitry, or any other suitable circuitry. In general, the resonator control circuitry 116 can be any suitable circuitry for providing a control signal to the first resonator capacitor C_R1, the second resonator capacitor C_R2, the first coupling capacitor C_C1, the second coupling capacitor C_C2, the third coupling capacitor C_C3, the fourth coupling capacitor C_C4, and the fifth coupling capacitor C_C5 in order to adjust the capacitances thereof and thus tune the weakly coupled resonator network 74 as desired.

While only three LC resonators are shown in the weakly coupled resonator network 74 shown in FIG. 11, any number of LC resonators may be provided without departing from the principles of the present disclosure. The coupling factor between the various LC resonators may be the same or different in order to provide a desirable resonant response of the weakly coupled resonator network 74. In general, additional LC resonators may provide additional resonant poles or peaks in the resonant response of the weakly coupled resonator network 74, which may be used to formulate a desired coupling using the power coupler circuitry 78 and/or a desired response of the radiating antenna element 70.

Figure 12:
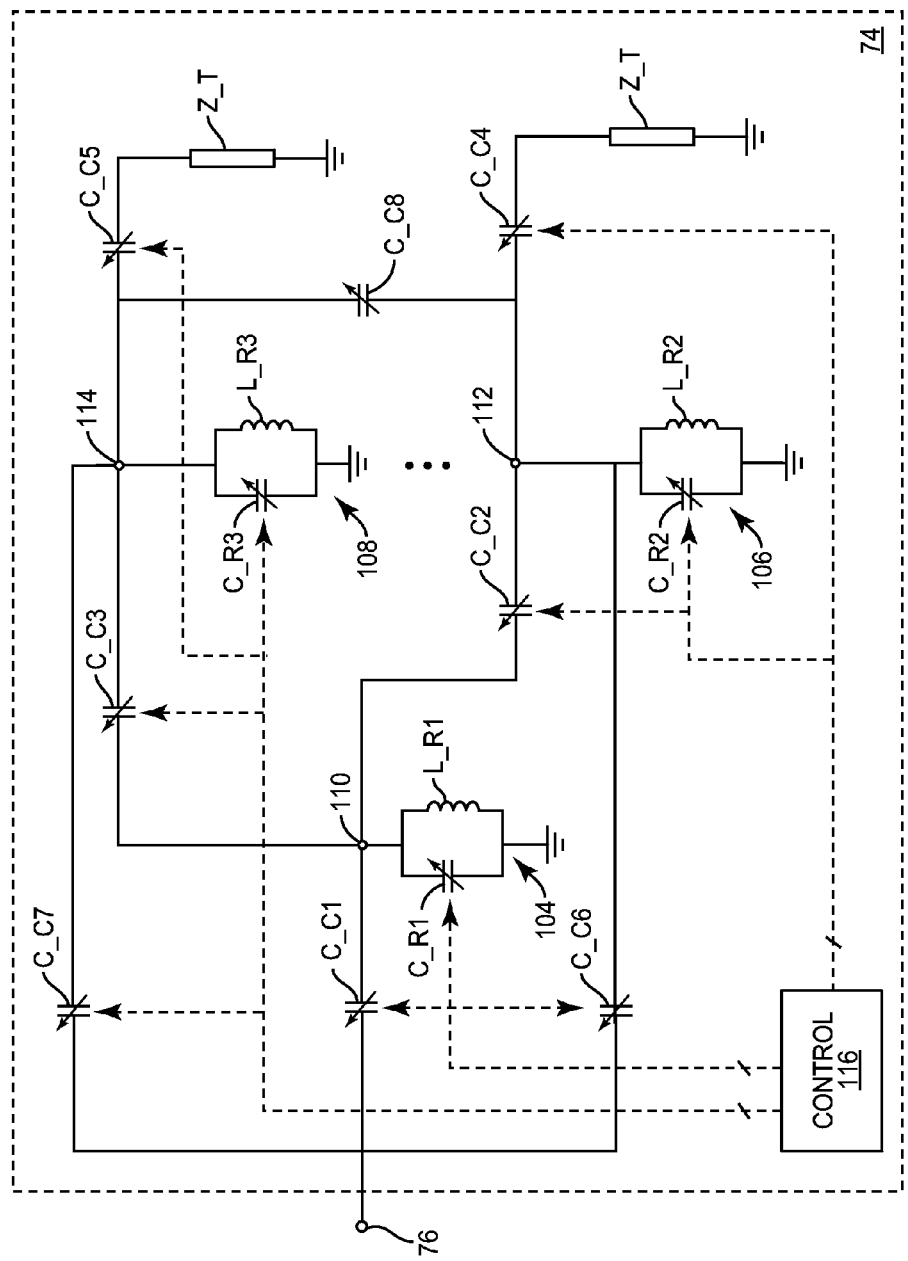
FIG. 12 shows a functional schematic of a weakly coupled resonator network according to one embodiment of the present disclosure.

FIG. 12 shows the weakly coupled resonator network 74 according to an additional embodiment of the present disclosure. The weakly coupled resonator network 74 shown in FIG. 12 is substantially similar to that shown in FIG. 11, but further includes a sixth coupling capacitor C_C6 coupled between the resonator network input node 76 and the second common node 112, a seventh coupling capacitor C_C7 coupled between the resonator network input node 76 and the third common node 114, and an eighth coupling capacitor C_C8 coupled between the second common node 112 and the third common node 114. The sixth coupling capacitor C_C6, the seventh coupling capacitor C_C7, and the eighth coupling capacitor C_C8 may implement additional feed-forward notches in the weakly coupled resonator network 74, which may result in a larger phase shift on the transmission line 82 and thus a greater ability to tune the antenna 80 as desired.

Figure 13:
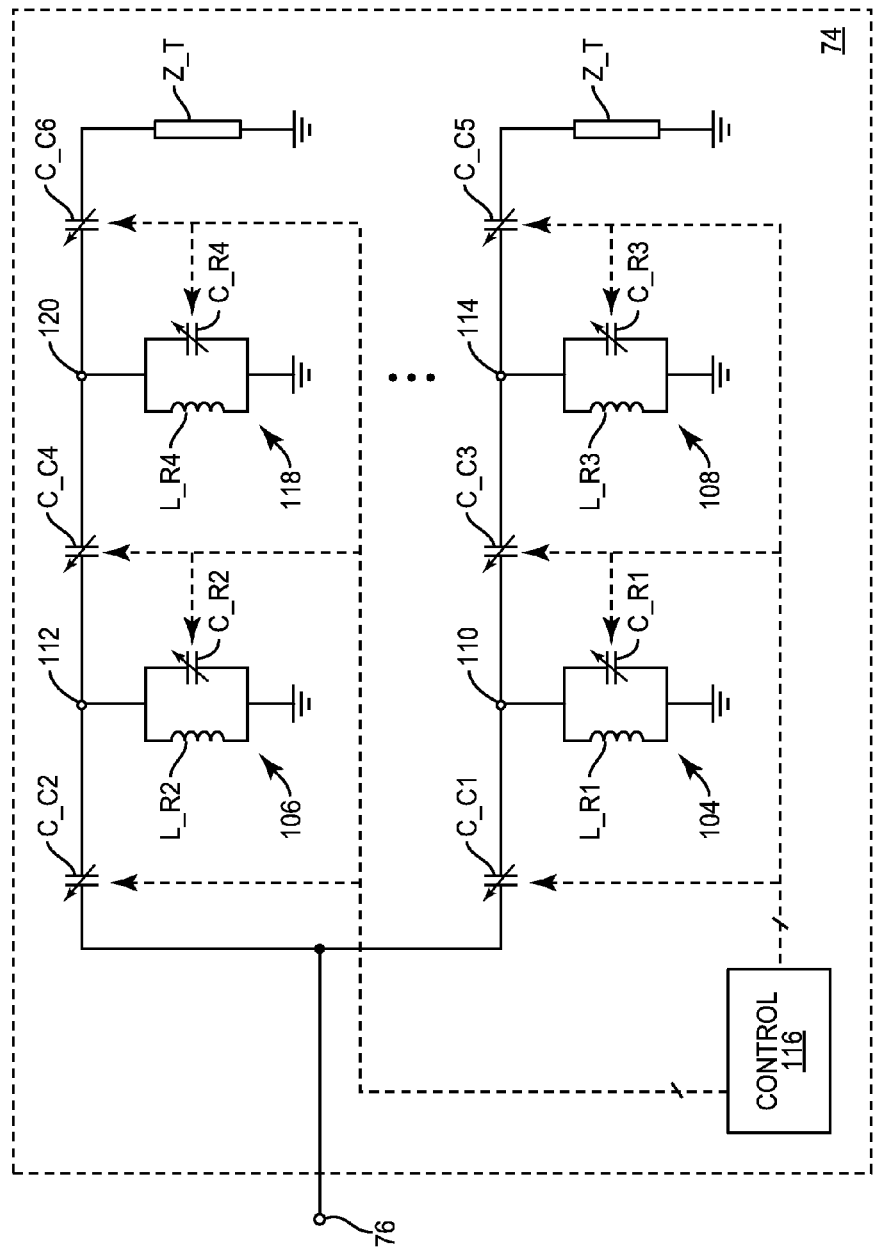
FIG. 13 shows a functional schematic of a weakly coupled resonator network according to one embodiment of the present disclosure.

FIG. 13 shows the weakly coupled resonator network 74 according to an additional embodiment of the present disclosure. The weakly coupled resonator network 74 shown in FIG. 13 is substantially similar to that shown in FIG. 11, but further includes a fourth LC resonator 118 coupled between the resonator network input node 76 and ground. The fourth LC resonator 118 includes a fourth resonator capacitor C_R4 and a fourth resonator inductor L_R4 coupled in parallel between the resonator network input node 76 and ground. The first coupling capacitor C_C1 is coupled between the resonator network input node 76 and the first common node 110. The second coupling capacitor C_C2 is coupled between the resonator network input node 76 and the second common node 112. The third coupling capacitor C_C3 is coupled between the first common node 110 and the third common node 114. The fourth coupling capacitor C_C4 is coupled between the second common node 112 and a fourth common node 120. A fifth coupling capacitor C_C5 is coupled between the third common node 114 and the first optional termination impedance Z_T. A sixth coupling capacitor C_C6 is coupled between the fourth common node 120 and the second optional termination impedance Z_T.

A coupling factor between the first LC resonator 104 and the third LC resonator 108 may be between about 1.0% and 40.0% (i.e., between about 0.01 and 0.4). A coupling factor between the second LC resonator 106 and the fourth LC resonator 118 may be between about 1.0% and 40.0% (i.e., between about 0.01 and 0.4). A coupling factor between the first LC resonator 104 and the second LC resonator 106 may be between about 1.0% and 40.0% (i.e., between about 0.01 and 0.4). A coupling factor between the third LC resonator 108 and the fourth LC resonator 118 may be less than about 1.0%. Accordingly, the weakly coupled resonator network 74 may have increased bandwidth and quality factor (Q) as described above. By including an extra resonator in the weakly coupled resonator network 74, the bandwidth of the network may be further increased to support additional operating bands in a carrier aggregation configuration.

While the foregoing embodiments show a particular number of resonators arranged in a particular manner, the disclosure is not so limited. Any number of resonators that are weakly coupled to one another may be used to provide support for any number of operating bands in a carrier aggregation configuration without departing from the principles described herein.

Figure 14A:
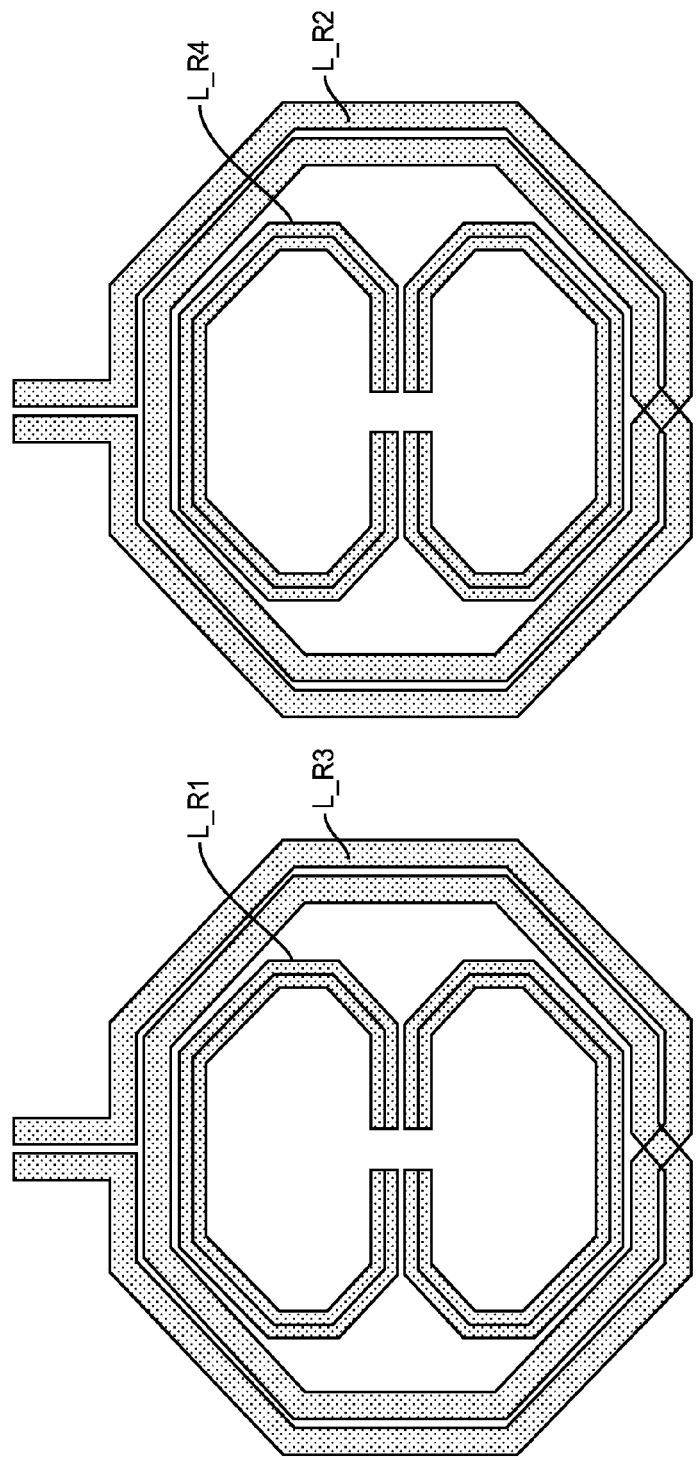
FIGS. 14A and 14B show various configurations for inductors in a weakly coupled resonator network according to one embodiment of the present disclosure.
Figure 14B:
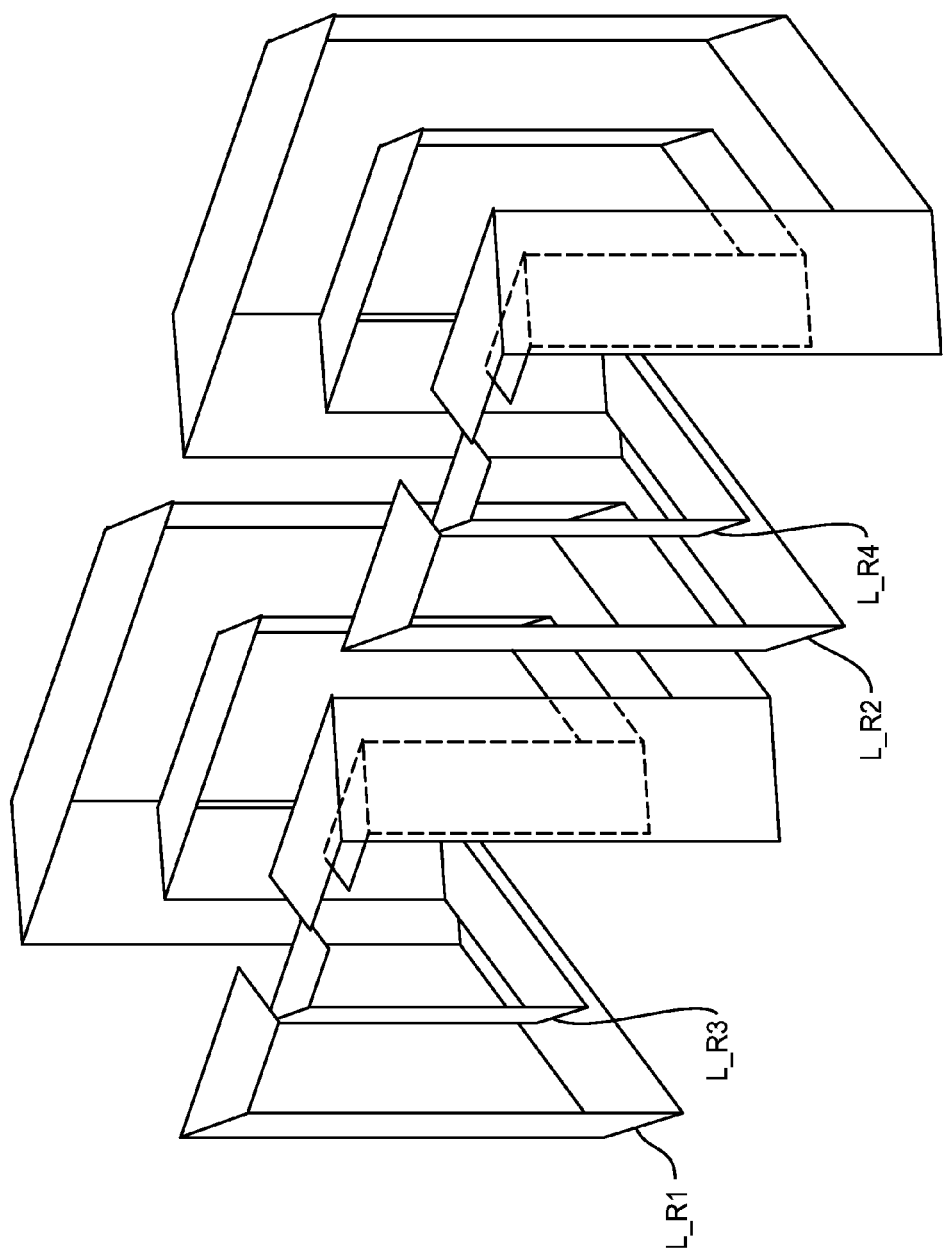

As discussed above, the coupling between the various LC resonators in the weakly coupled resonator network 74 may be achieved via specific placement of the inductors in the resonators. FIGS. 14A and 14B illustrate various configurations for the first resonator inductor L_R1, the second resonator inductor L_R2, the third resonator inductor L_R3, and the fourth resonator inductor L_R4 shown in FIG. 13. Specifically, FIG. 14A shows two nested two-dimensional inductors such that the third resonator inductor L_R3 and the fourth resonator inductor L_R4 are shaped like a figure "8", and the first resonator inductor L_R1 and the second resonator inductor L_R2 surround the third resonator inductor L_R3 and the fourth resonator inductor L_R4, respectively. Because the third resonator inductor L_R3 is surrounded by the first resonator inductor L_R1, and because the fourth resonator inductor L_R4 is surrounded by the second resonator inductor L_R2, electromagnetic coupling occurs between the respective inductors. Further, because the first resonator inductor L_R1 and the second resonator inductor L_R2 are adjacent to one another, they are also electromagnetically coupled. This increases the isolation of the weakly coupled resonator network 74 as discussed above. However, due to shielding provided by the first resonator inductor L_R1 and the second resonator inductor L_R2, the third resonator inductor L_R3 and the fourth resonator inductor L_R4 have minimal coupling with one another. Accordingly, the desired coupling factors between the first resonator inductor L_R1, the second resonator inductor L_R2, the third resonator inductor L_R3, and the fourth resonator inductor L_R4 may be achieved with a minimal footprint.

FIG. 14B shows the first resonator inductor L_R1 and the third resonator inductor L_R3 as three-dimensional inductors wherein the third resonator inductor L_R3 is nested inside of the first resonator inductor L_R1. Further, FIG. 14B shows the second resonator inductor L_R2 and the fourth resonator inductor L_R4 as three-dimensional inductors wherein the fourth resonator inductor L_R4 is nested inside of the second resonator inductor L_R2. Due to the three-dimensional structure of the first resonator inductor L_R1 and the second resonator 68, the magnetic field of each inductor is substantially confined to an interior of the three-dimensional space bounded thereby. This results in coupling between the first resonator inductor L_R1 and the third resonator inductor L_R3 and coupling between the second resonator inductor L_R2 and the fourth resonator inductor L_R4. Further, due to the fact that the first resonator inductor L_R1 and the second resonator inductor L_R2 are adjacent to one another, and that not all of the magnetic field of each is confined to the interior thereof, a small amount of coupling will also occur between the first resonator inductor L_R1 and the second resonator inductor 62, which, as discussed above, results in cross-isolation between the two. Providing the first resonator inductor L_R1, the second resonator inductor L_R2, the third resonator inductor L_R3, and the fourth resonator inductor L_R4 as shown results in the ability to control the coupling factors there-between as desired while consuming minimal space with the inductors.

Those skilled in the art will recognize improvements and modifications to the embodiments of the present disclosure. All such improvements and modifications are considered within the scope of the concepts disclosed herein and the claims that follow.

What is claimed is:

1. Antenna aperture tuning circuitry comprising:
   a first signal path connected between an antenna radiating element and a ground;
   a second signal path connected in parallel with the first signal path between the antenna radiating element and the ground;
   a first LC resonator and a second LC resonator each connected between the first signal path and the ground, wherein the first LC resonator and the second LC resonator are electromagnetically coupled such that a coupling factor between the first LC resonator and the second LC resonator is between about 1.0% and 40.0%; and
   a third LC resonator and a fourth LC resonator each connected between the second signal path and the ground, wherein the third LC resonator and the fourth LC resonator are electromagnetically coupled such that a coupling factor between the third LC resonator and the fourth LC resonator is between about 1.0% and 40.0%.

2. The antenna aperture tuning circuitry of claim 1 wherein a quality factor of the antenna aperture tuning circuitry is between about 10 and 500.

3. The antenna aperture tuning circuitry of claim 1 wherein the first LC resonator, the second LC resonator, the third LC resonator, and the fourth LC resonator each comprise a resonator inductor coupled in parallel with a resonator capacitor between a common node and the ground.

4. The antenna aperture tuning circuitry of claim 3 further comprising:
   a first coupling capacitor coupled between the common node of the first LC resonator and the common node of the second LC resonator; and
   a second coupling capacitor coupled between the common node of the third LC resonator and a common node of the fourth LC resonator.

5. The antenna aperture tuning circuitry of claim 4 wherein a capacitance of the first coupling capacitor and a capacitance of the second coupling capacitor is adjustable.

6. The antenna aperture tuning circuitry of claim 5 wherein a capacitance of the resonator capacitor in each one of the first LC resonator, the second LC resonator, the third LC resonator, and the fourth LC resonator is adjustable.

7. The antenna aperture tuning circuitry of claim 6 further comprising control circuitry configured to adjust the capacitance of one or more of the first coupling capacitor, the second coupling capacitor, the resonator capacitor in the first LC resonator, the resonator capacitor in the second LC resonator, the resonator capacitor in the third LC resonator, and the resonator capacitor in the fourth LC resonator in order to adjust an aperture of the antenna radiating element.

8. The antenna aperture tuning circuitry of claim 7 wherein the antenna aperture tuning circuitry is configured to simultaneously tune the antenna radiating element for at least two different operating bands.

9. Power coupler circuitry comprising:
   a power coupler configured to couple a portion of electromagnetic power from a transmission line coupled to an antenna, the power coupler comprising:
   an isolated node;
   a coupled node; and
   a coupling line between the isolated node and the coupled node; and
   a resonator network coupled to the isolated node of the power coupler and comprising:
   a first LC resonator connected between the isolated node and a ground; and
   a second LC resonator connected between the isolated node and the ground and electromagnetically coupled with the first LC resonator such that a coupling factor between the first LC resonator and the second LC resonator is between about 1.0% and 40.0%.

10. The power coupler circuitry of claim 9 further comprising a third LC resonator coupled in parallel with one or more of the first LC resonator and the second LC resonator.

11. The power coupler circuitry of claim 10 wherein the first LC resonator, the second LC resonator, and the third LC resonator each comprise a resonator inductor coupled in parallel with a resonator capacitor between a common node and the ground.

12. The power coupler circuitry of claim 11 further comprising:
    a first coupling capacitor coupled between the common node of the first LC resonator and the common node of the second LC resonator; and
    a second coupling capacitor coupled between the common node of the first LC resonator and the common node of the third LC resonator.

13. The power coupler circuitry of claim 12 wherein a capacitance of the first coupling capacitor and a capacitance of the second coupling capacitor is adjustable.

14. The power coupler circuitry of claim 13 wherein a capacitance of the resonator capacitor in each one of the first LC resonator, the second LC resonator, and the third LC resonator is adjustable.

15. The power coupler circuitry of claim 14 further comprising control circuitry configured to adjust the capacitance of one or more of the first coupling capacitor, the second coupling capacitor, the resonator capacitor in the first LC resonator, the resonator capacitor in the second LC resonator, and the resonator capacitor in the third LC resonator.

16. The power coupler circuitry of claim 15 wherein the resonator network is configured to simultaneously resonate in at least two different operating bands.

17. Multiplexer and antenna impedance matching circuitry comprising:
    a first signal path coupled between an antenna node and a first input/output node;
    a second signal path coupled between the antenna node and a second input/output node;
    a first LC resonator and a second LC resonator each coupled between the first signal path and a ground, wherein the first LC resonator and the second LC resonator are electromagnetically coupled such that a coupling factor between the first LC resonator and the second LC resonator is between about 1.0% and 40.0%;
    a third LC resonator and a fourth LC resonator each coupled between the second signal path and the ground, wherein the third LC resonator and the fourth LC resonator are electromagnetically coupled such that a coupling factor between the third LC resonator and the fourth LC resonator is between about 1.0% and 40.0%; and
    wherein the multiplexer and antenna impedance matching circuitry is configured to:

pass signals within a first frequency band between the first input/output node and the antenna node while attenuating signals outside of the first frequency band along the first signal path;

pass signals within a second frequency band between the second input/output node and the antenna node while attenuating signals outside of the second frequency band along the second signal path; and match an impedance presented at the antenna node to an impedance presented at one or more of the first input/output node and the second input/output node.

18. The multiplexer and antenna impedance matching circuitry of claim 17 wherein:

a coupling factor between the first LC resonator and the third LC resonator is between about 1.0% and 40.0%;

a coupling factor between the first LC resonator and the fourth LC resonator is less than about 1.0%;

a coupling factor between the second LC resonator and the third LC resonator is less than about 1.0%; and a coupling factor between the second LC resonator and the fourth LC resonator is less than about 1.0%.

19. The multiplexer and antenna impedance matching circuitry of claim 18 wherein:

each one of the first LC resonator, the second LC resonator, the third LC resonator, and the fourth LC resonator include a resonator inductor and a resonator capacitor coupled in parallel; and the resonator capacitor of each one of the first LC resonator, the second LC resonator, the third LC resonator, and the fourth LC resonator is adjustable.

20. The multiplexer and antenna impedance matching circuitry of claim 19 further comprising control circuitry configured to adjust a capacitance of the resonator capacitor for each one of the first LC resonator, the second LC resonator, the third LC resonator, and the fourth LC resonator, and a number of coupling capacitors connected between the first LC resonator, the second LC resonator, the third LC resonator, and the fourth LC resonator.

* * * * *